(12) United States Patent
Lin

(10) Patent No.: US 7,467,443 B2
(45) Date of Patent: Dec. 23, 2008

(54) RETAINING TOOL WITH ROTATIONAL LOCATING DEVICE

(75) Inventor: Sheng-Huang Lin, Taipei (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 70 days.

(21) Appl. No.: 11/189,947

(22) Filed: Jul. 27, 2005

(65) Prior Publication Data

US 2007/0025083 A1     Feb. 1, 2007

(51) Int. Cl.
*H05K 7/20* (2006.01)
(52) U.S. Cl. ........................ 24/459; 361/704
(58) Field of Classification Search .......... 24/457–459; 361/704, 707, 709, 710, 717–719; 257/718, 257/719, 726, 727; 165/80.2, 80.3, 185
See application file for complete search history.

(56) References Cited

U.S. PATENT DOCUMENTS

| | | | |
|---|---|---|---|
| 6,731,504 B1* | 5/2004 | Liu | 361/704 |
| 6,795,317 B1* | 9/2004 | Liu | 361/704 |
| 7,061,764 B2* | 6/2006 | Lai et al. | 361/704 |
| 7,126,823 B2* | 10/2006 | Chen et al. | 361/702 |
| 2004/0179340 A1* | 9/2004 | Lin | 361/704 |
| 2005/0141201 A1* | 6/2005 | Chen et al. | 361/704 |

* cited by examiner

*Primary Examiner*—James R Brittain

(57) ABSTRACT

A retaining tool with rotational locating device includes a main frame and a locator. The main frame provides a first lock part at an end thereof. The locator rotationally inserts through the main frame next to the other end thereof. The locator further includes an adjustable unit and a locking unit attached to the adjustable unit. The locking unit has a second lock part at the lower section thereof corresponding to the first lock part. The lock parts engage with an object and the locking unit with the second lock part is capable of moving vertically in case of the adjustable unit being turned horizontally. The object is forced to keep contact other objects tightly or to release from contacting other objects.

4 Claims, 10 Drawing Sheets

RETAINING TOOL WITH ROTATIONAL LOCATING DEVICE

BACKGROUND OF THE INVENTION

1. Field of the Invention

The present invention is related to a retaining tool with rotational locating device and particularly to a rotational locating device capable of fixing a heat sink to a central processing unit (CPU).

2. Brief Description of the Related Art

Due to electronic product such as computer being popularly used and being widely applied to any fields, the electronic technology industry develops rapidly toward high speed operation and high data storage capacity and it results in high heat during the electronic parts running under high speed.

Taking the host unit of a computer as an example, most heat therein is generated from the CPU and the heat staying in the CPU exceeding the allowable value leads to shut down of the computer. Further, in order to solve problem relating to electromagnetic wave radiation, the host unit is enclosed with a casing. Under this circumference, how to release the heat from the CPU and other heat generating components as fast as possible becomes an important subject has to be cared.

Usually, heat dissipation of the CPU is done with a heat sink with a plurality of cooling fins being disposed at a side thereof and another side thereof contacting the CPU. In this way, the heat generated by the CPU is able to transmit to the cooling fin end and the heat is capable of moving outward via radiation or a fan, which is added to the heat sink. Thus, it is necessary for the CPU keeping contact with heat sink tightly, otherwise, it is easy to become heat resistance increase and degrade effect of heat dissipation largely. The conventional fixing device for the CPU being joined to the heat sink shown in FIGS. 1 and 2 provides a locking part 1 and the locking part has a locking bar 11 with an end thereof extending downward a vertical part 110. The lower end of the vertical part 110 has a through hole 111 capable of engaging a jut (not shown) at a lateral side of a joining seat H bearing a CPU C. Another end of the locking bar 11 has slots 112 for being inserted with a hanging part 12. The hanging part 12 with a fitting hole 121 is pivotally jointed to a handle O with an eccentric hole O1 with a pivot S passing through the fitting hole 121 and the eccentric hole O1. When the handle O is turned with respect to the pivot S, the hanging part 12 moves vertically to secure a heat sink R to the CPU C via a through hole 122 engaging another jut H1 at the other side of the joining seat H.

However, the locking part 1 forcing the heat sink R to approach and contact the CPU C by means of an eccentric device or cam producing a restriction force has the following deficiencies:

1. The handle O has a low dead point such that it is not easy to press the locking part 1 firmly.
2. Due to insufficient binding force being created by the dead point, it is easy to result in lock failure or loosening in case of dropping down and occurring shock.
3. The handle O easily becomes tilt after the locking part 1 being in a state of engaging.
4. Undesirable contact is formed between the heat sink R and the CPU C to increase thermal resistance to decrease effect of heat removal.

SUMMARY OF THE INVENTION

In order to solve the preceding problems, an object of the present invention is to provide a retaining tool with rotational locating device with which tight contact between the heat sink and the CPU is capable of reaching to decrease the thermal resistance and enhancing the binding force to the heat sink and the CPU significantly.

Another object of the present invention is to provide a retaining tool with rotational locating device in which a locator rotates and is located by means of a guiding groove with a preset specific path to increase the binding force to the CPU and the heat sink greatly.

A further object of the present invention is to provide a retaining tool with rotational locating device with which the binding force to the CPU and the heat sink intersects the locking force of the locator so as to avoid locking failure or loosening in case of dropping down and occurring shock.

Accordingly, a retaining tool with rotational locating device according to the present invention includes a main frame and a locator. The main frame provides a lock part at an end thereof. The locator rotationally inserts through the main frame next to the other end thereof. The locator further includes an adjustable unit and a locking unit attached to the adjustable unit. The locking unit has a lock part at the lower section thereof corresponding to the first lock part. The lock parts engage with an object and the locking unit with the second lock part is capable of moving vertically in case of the adjustable unit being turned horizontally. The object is forced to contact other objects tightly or to release from contacting other objects easily.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
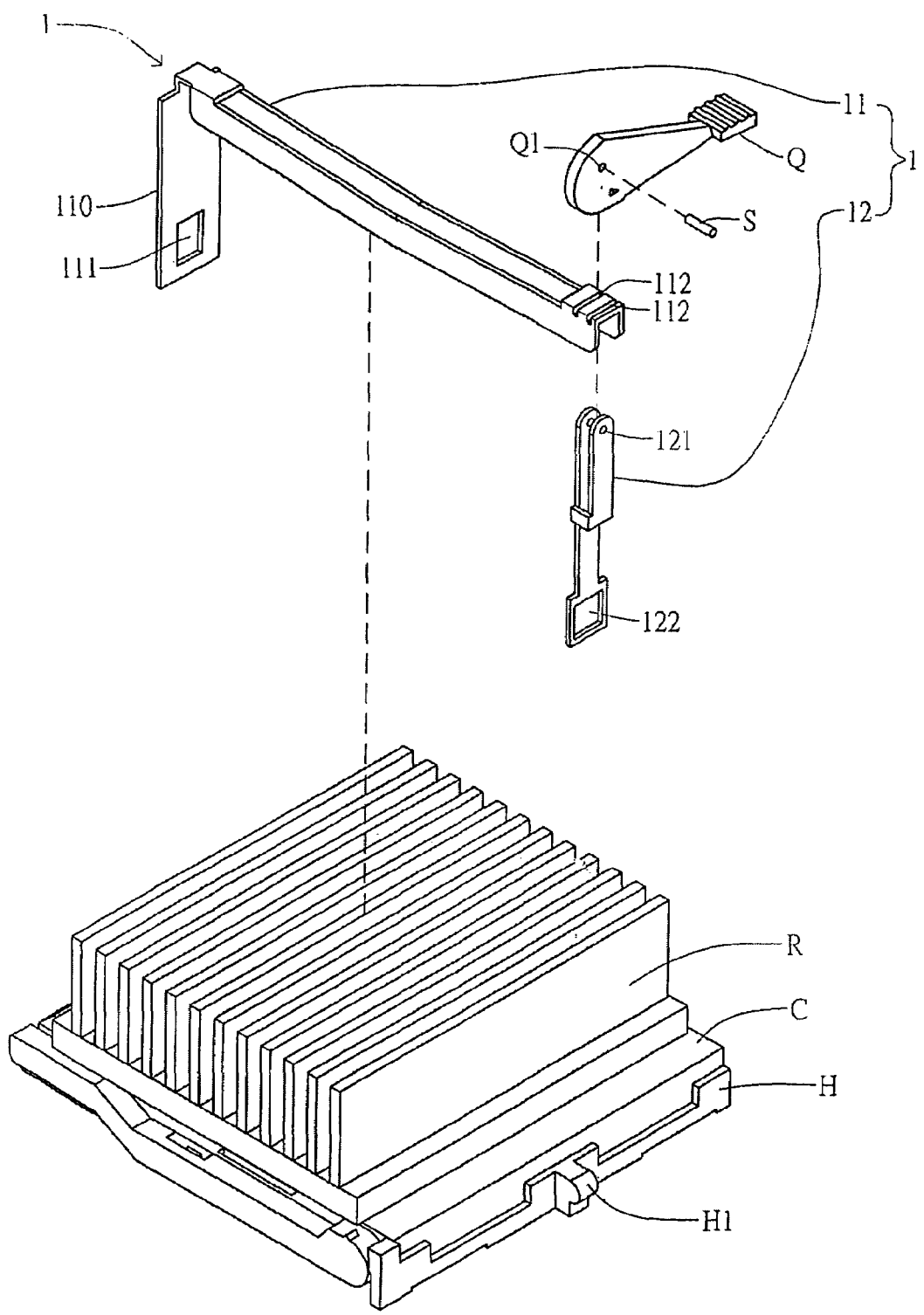
FIG. 1 is an exploded perspective view of a conventional fixing device for a heat sink illustrating the fixing device being detached from the heat sink.
Figure 2:
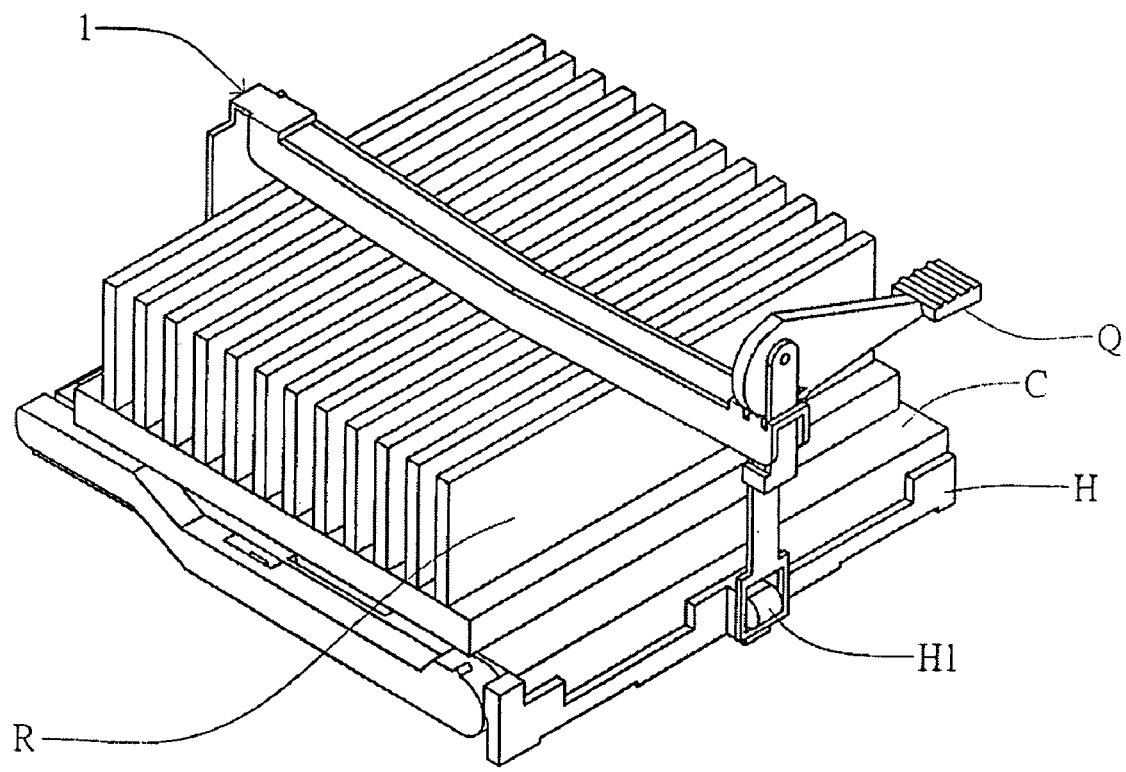
FIG. 2 is an assembled perspective view of the conventional fixing device shown in FIG. 1 illustrating the fixing device being attached to the heat sink.
Figure 3:
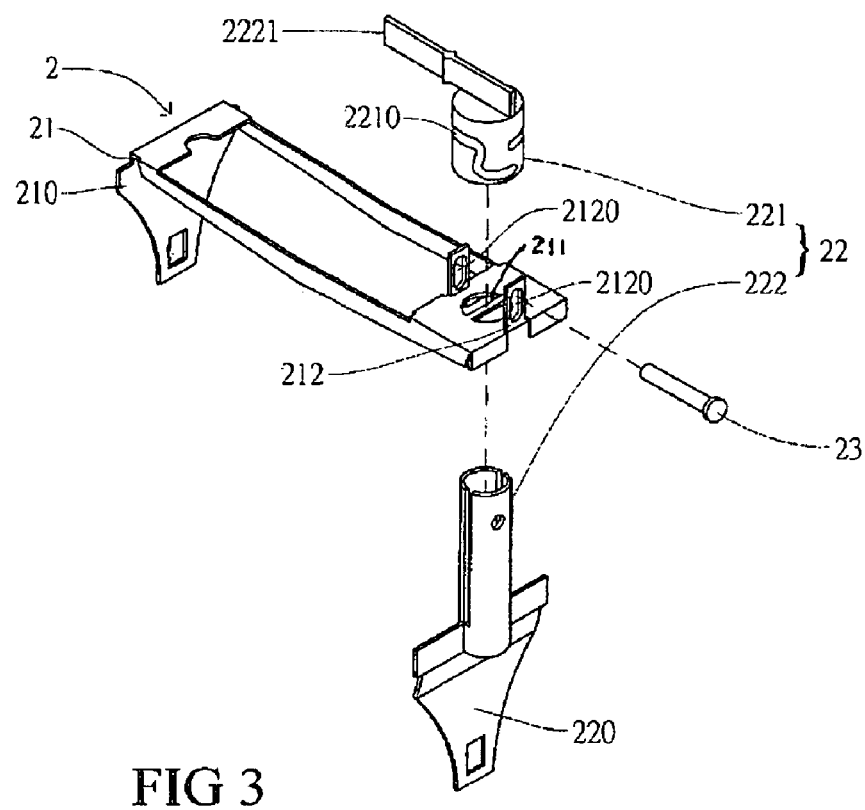
FIG. 3 is an exploded perspective view of the first embodiment of a retaining tool with rotational locating device according to the present invention in operation.
Figure 4:
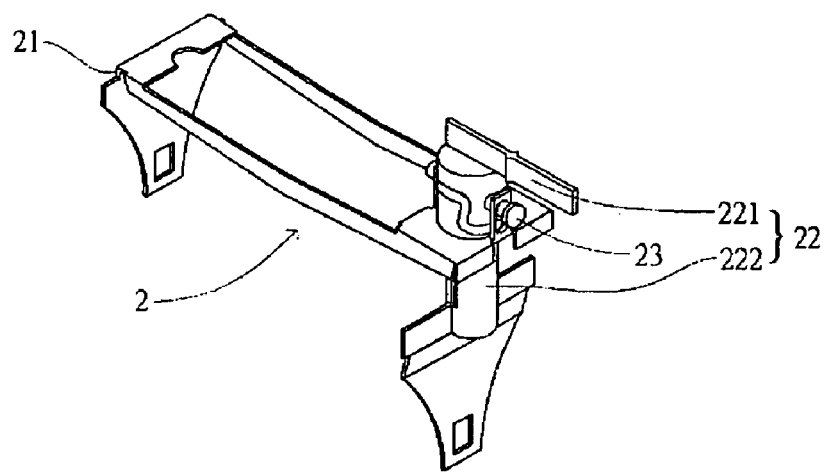
FIG. 4 is an assembled perspective view of the first embodiment of a retaining tool with rotational locating device according to the present invention shown in FIG. 3.
Figure 5:
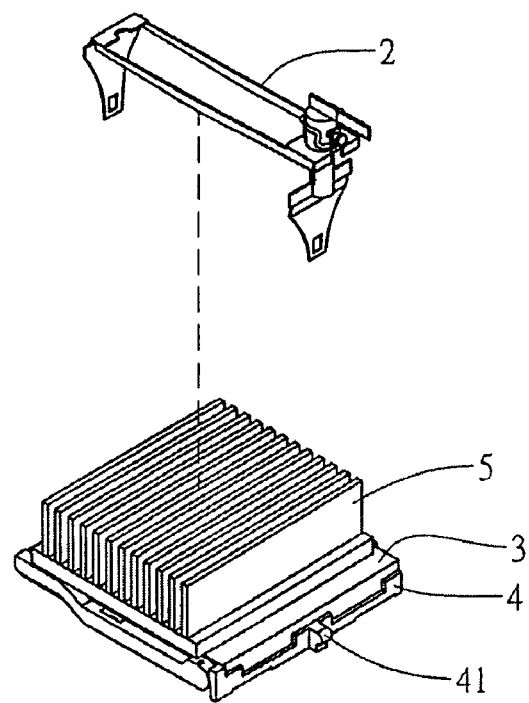
FIG. 5 is a perspective view illustrating the first embodiment of a retaining tool with rotational locating device according to the present invention being ready for fixing to the heat sink.
Figure 6:
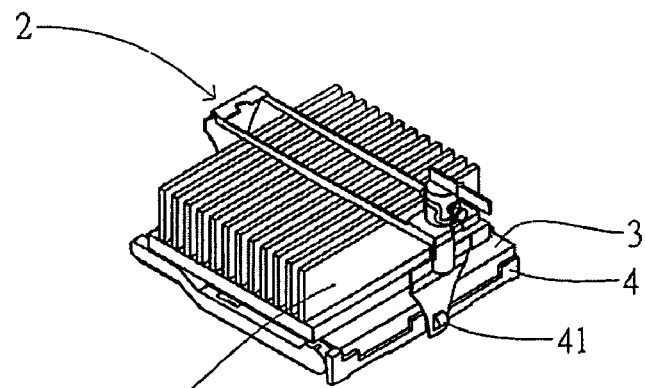
FIG. 6 is a perspective view illustrating first embodiment of a retaining tool with rotational locating device according to the present invention fixing to the heat sink.

Referring to FIGS. 3, 4, 5 and 6, the first embodiment of a retaining tool with rotational locating device according to the present invention provides a retaining tool 2, which includes a main frame 21 and a locator 22.

The main frame 21 is inserted with the locator 22. The main frame 21 has a first lock part 210 at an end thereof for fixedly attaching with a jut 41 protruding outward from a lateral side of a Joining seat 4, which bears a CPU (central processing unit 3). The locator 22 is inserted into another end of the main frame 21.

The locator 22 has a locking unit 222 with a second lock part 220, which is disposed opposite to the first lock part 210, to engage with another jut 41 at another lateral side of the joining seat 4 and the lock part 220 is driven with the locator 22 to force the heat sink 5 to contact with the CPU 3 tightly. Under this circumstances thermal resistance between the heat sink 5 and the CPU 3 decreases greatly in accordance with engagement between the CPU 3 and the heat sink 5 such that it is capable of avoiding undesirable locking failure resulting from the preceding parts loosening and dropping down.

The locator 22 further includes a cylinder shaped adjustable unit 221 except the locking unit 222. The adjustable unit 221 provides a guide groove 2210 at the circumferential side thereof and horizontally extends outward a handle 2221 from the top side thereof for being turned by a user. The main frame 21 is a two-parallel-elongated arm shaped lever with a flat plate portion at the other end thereof being opposite to the end joining the first lock part 210. A circular opening 211 with a diametrical crossing bar is provided at the flat plate portion. The locking unit 222 is a cylindrical post with a diametrical silt extending downward from the upper end thereof to correspond to the diametrical bar such that the locking unit 222 is capable of inserting through the opening 211 to couple with the adjustable unit 221. The lower end of the locking unit 222 is joined to the second lock part 220.

Besides, two opposite holding arms 212 extend upward from two opposite lateral sides of the flat plate portion next to the opening 211 with an elongated hole 2120 being provided at the respective holding arm 212 corresponding to a transverse through hole at the upper end of the locking unit 222 and the guide groove 2210 of the adjustable unit 221 for the spindle 23 being able to pass through the elongated hole 2120, the guide groove 2210 and the transverse through hole respectively. Hence, when the adjustable unit 221 is turned, the spindle 23 is capable of moving upward or downward in accordance with the profile of the guide groove 2210 to move the second lock part 220 of the locking unit 222 for tightening or loosening the CPU 3, the joining seat 4 and the heat sink 5. Further, when the adjustable unit 221 is turned to a position of the lowest end of the guide groove 2210 contacting the spindle 23, the CPU 3, the joining seat 4 and the heat sink 5 are in a state of extreme tightness. In this way, undesirable locking failure can be avoidable effectively.

Figure 7:
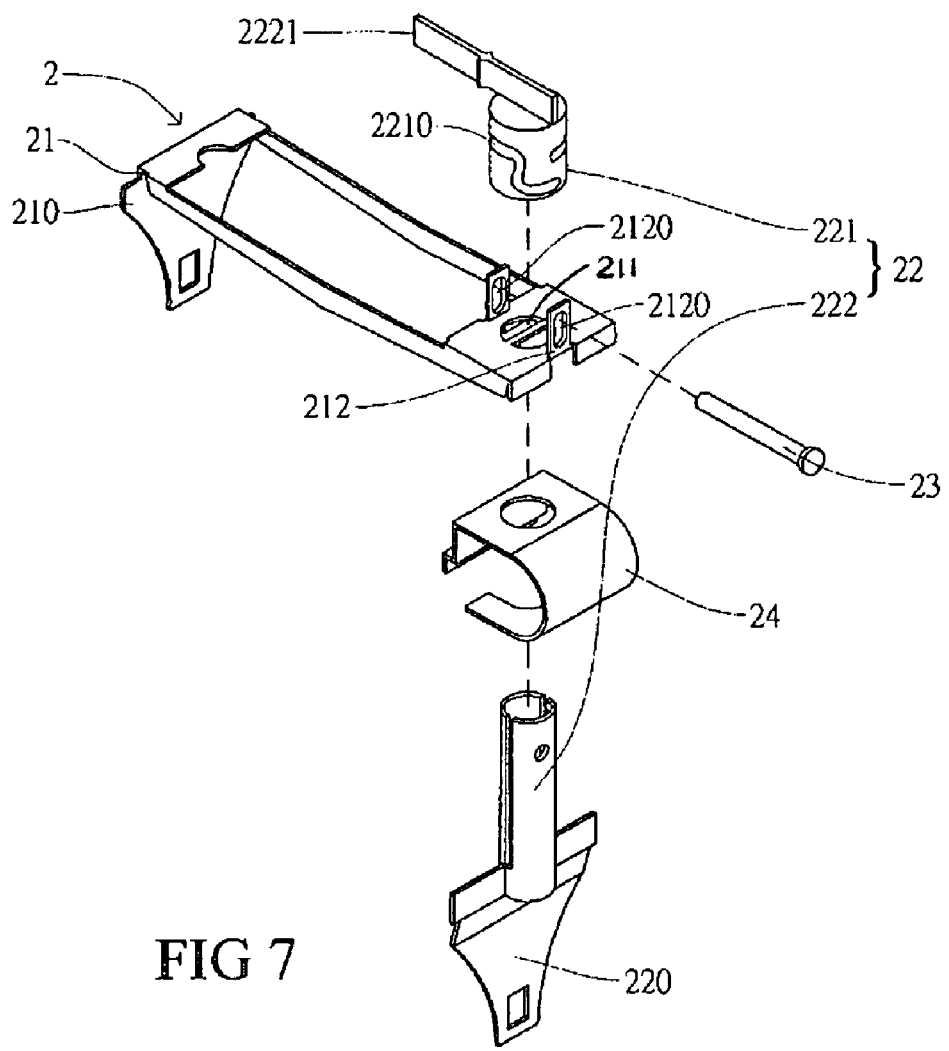
FIG. 7 is an exploded perspective view of the second embodiment of a retaining tool with rotational locating device according to the present invention.
Figure 8:
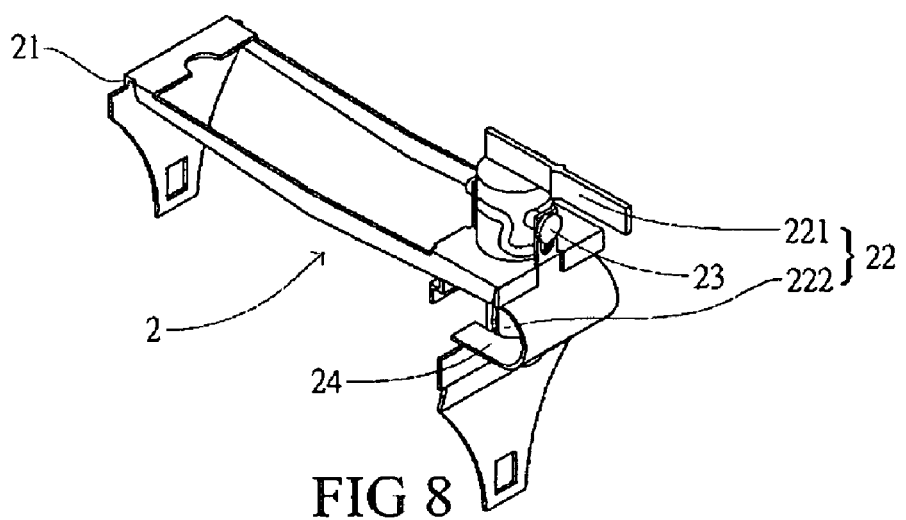
FIG. 8 is an assembled perspective view of the first embodiment of a retaining tool with rotational locating device according to the present invention shown in FIG. 7.

Referring to FIGS. 7 and 8, the second embodiment of a retaining tool with rotational locating device according to the present invention is illustrated. The difference of the present embodiment from the first embodiment is in that the retaining tool 2 provides a C-shaped elastic member 24 between the main frame 21 and the locking unit 222 with a hole at the top thereof and a recess at the bottom thereof for the locking unit 222 passing through the elastic member 24 and then penetrating the circular opening 212 before being attached to the adjustable unit 221. The elastic member 24 biases the locking unit 222 and the main frame respectively for increasing stability of the locking unit 222 and avoiding shaking of the locking unit 222 resulting from vibration. Further, the elastic member 24 is helpful for the locking unit 222 engaging with the jut 41 of the joining seat 4.

Figure 9:
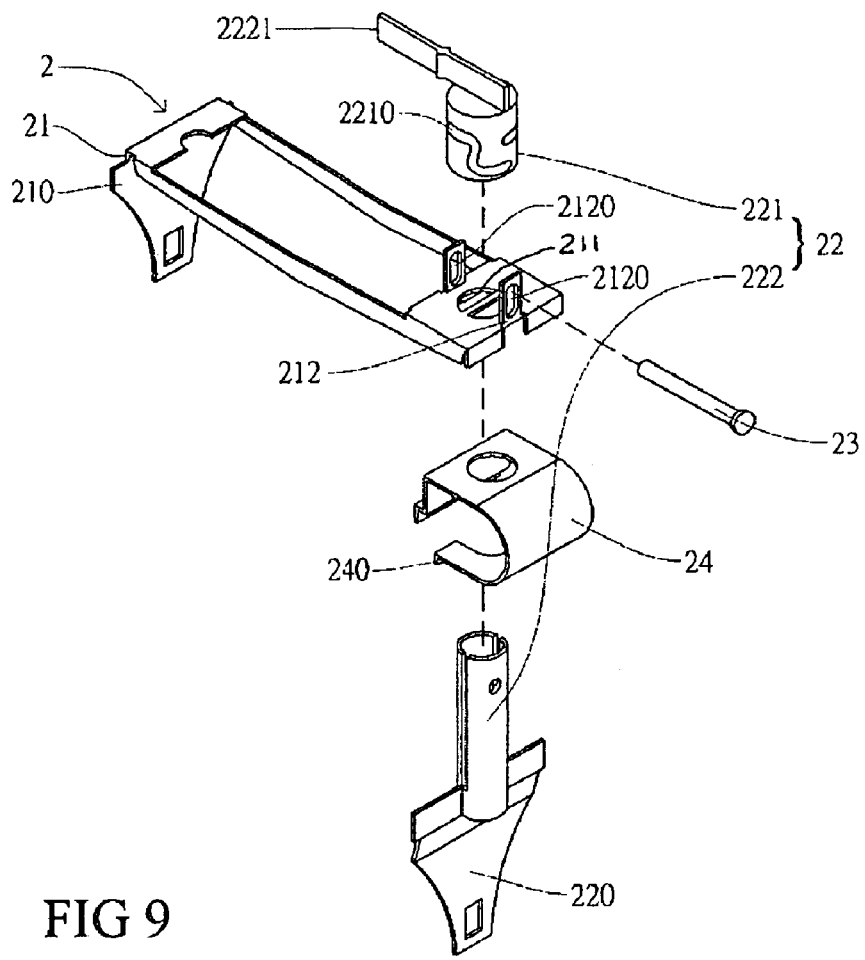
FIG. 9 is an exploded perspective view of the third embodiment of a retaining tool with rotational locating device according to the present invention.
Figure 10:
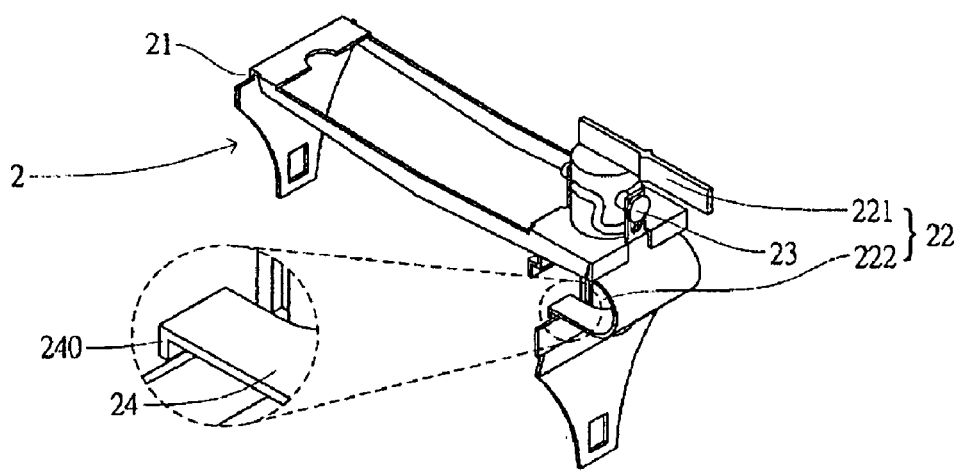
FIG. 10 is an assembled perspective view of the third embodiment of a retaining tool with rotational locating device according to the present invention shown in FIG. 9.

Referring to FIGS. 9 and 10, the third embodiment of a retaining tool with rotational locating device according to the present invention is illustrated. The difference of the present embodiment from the second embodiment is in that the bottom of the elastic member 24 extends downward a clip part 240 to catch the top of the second lock part 220 for increasing binding force of the elastic member 24 to the locking unit 222.

Figure 11:
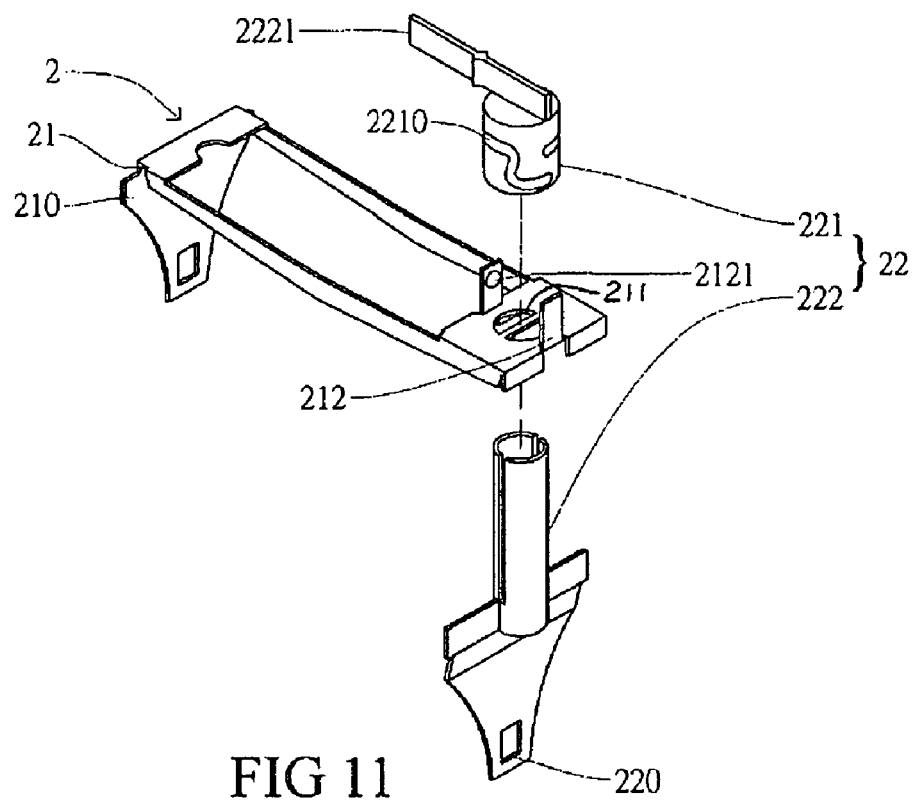
FIG. 11 is an exploded perspective view of the fourth embodiment of a retaining tool with rotational locating device according to the present invention.
Figure 12:
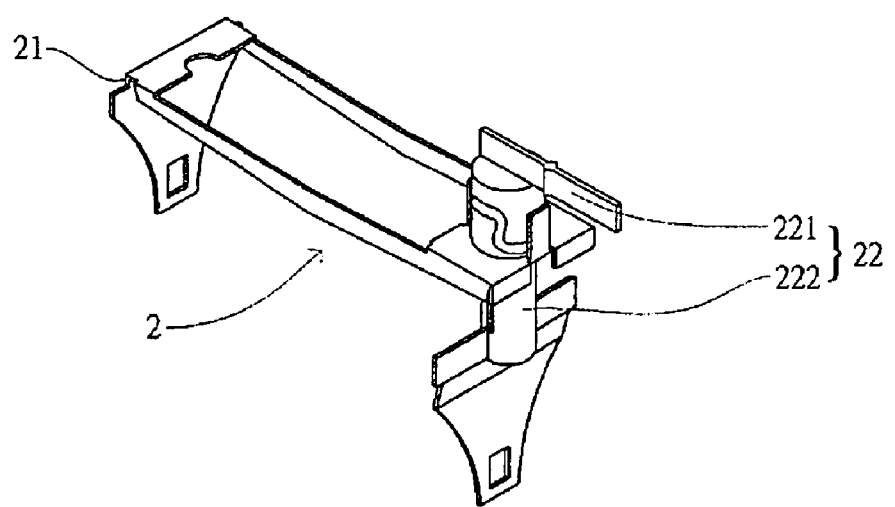
FIG. 12 is an assembled perspective view of the third embodiment of a retaining tool with rotational locating device according to the present invention shown in FIG. 11.

Referring to FIGS. 11 and 12, the fourth embodiment of a retaining tool with rotational locating device according to the present invention is illustrated. The difference of the present embodiment from the first embodiment is in that the respective holding arm 212 has a projection 2121 to keep contact with the guiding groove 2210 instead of the elongated hole being passed through with the spindle 23 shown in FIGS. 3 and 4. Once the locator 22 is turned, the adjustable unit 221 is capable of moving downward to push the locking unit 222 or upward to release from the locking unit 222 in addition to rotating so that the locking unit 222 is able to perform the job of engagement and disengagement.

Figure 13:
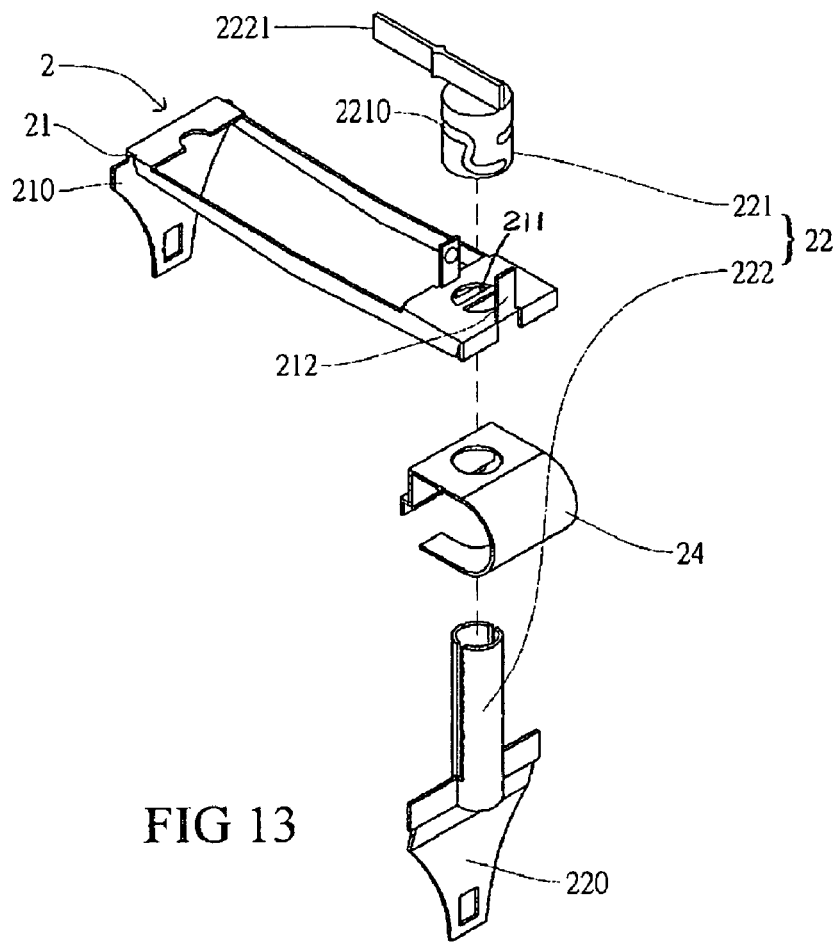
FIG. 13 is an exploded perspective view of the fifth embodiment of a retaining tool with rotational locating device according to the present invention.
Figure 14:
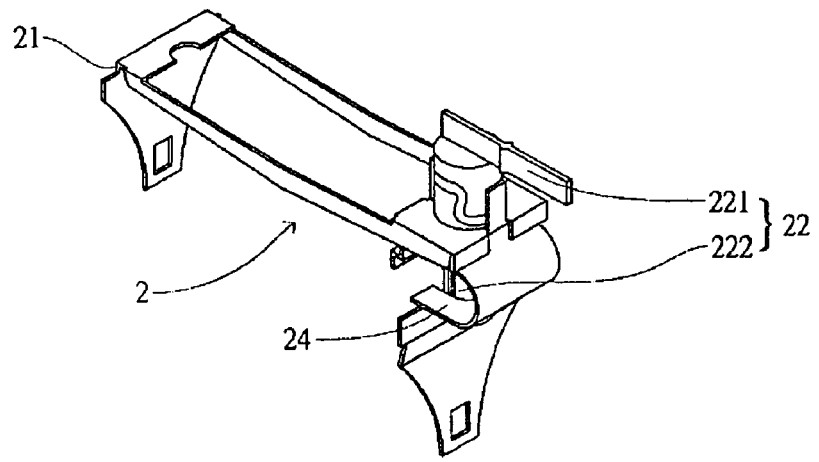
FIG. 14 is an assembled perspective view of the third embodiment of a retaining tool with rotational locating device according to the present invention shown in FIG. 13.

Referring to FIGS. 13 and 14, the fifth embodiment of a retaining tool with rotational locating device according to the present invention is illustrated. The difference of the present embodiment from the second embodiment is in that the respective holding arm 212 has a projection 2121 to keep contact with the guiding groove 2210 instead of the elongated hole being passed through with the spindle 23 shown in FIGS. 7 and 8. Once the locator 22 is turned, the adjustable unit 221 is capable of moving downward to push the locking unit 222 or upward to release from the locking unit 222 in addition to rotating so that the locking unit 222 is able to perform the job of engagement and disengagement.

Figure 15:
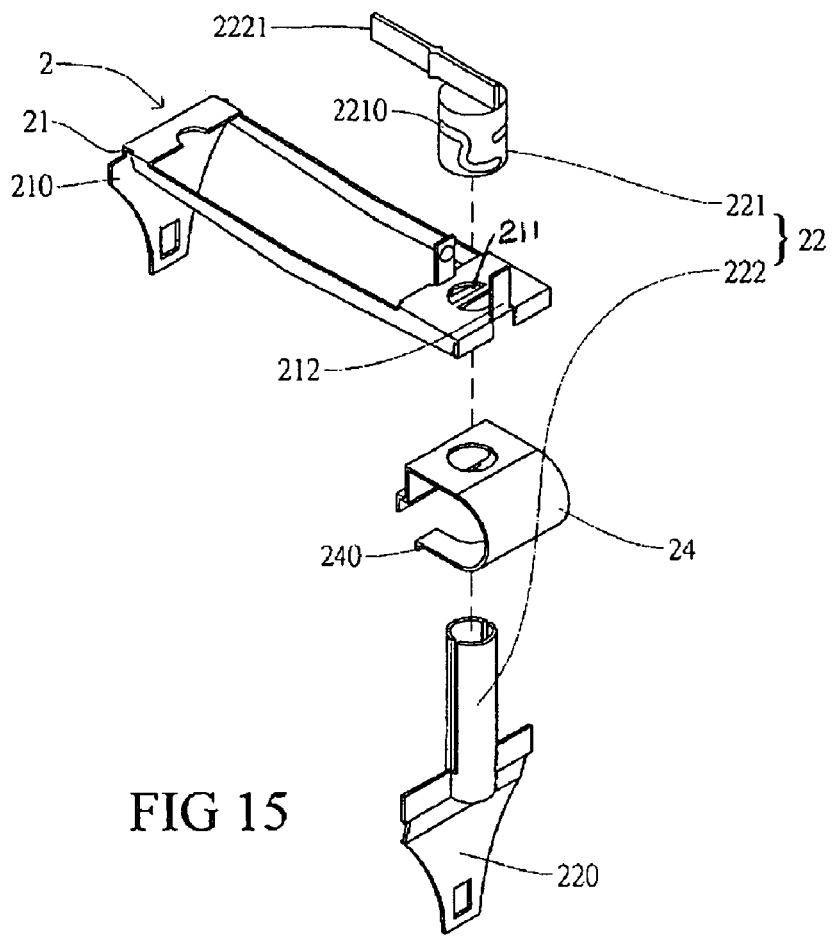
FIG. 15 is an exploded perspective view of the sixth embodiment of a retaining tool with rotational locating device according to the present invention.
Figure 16:
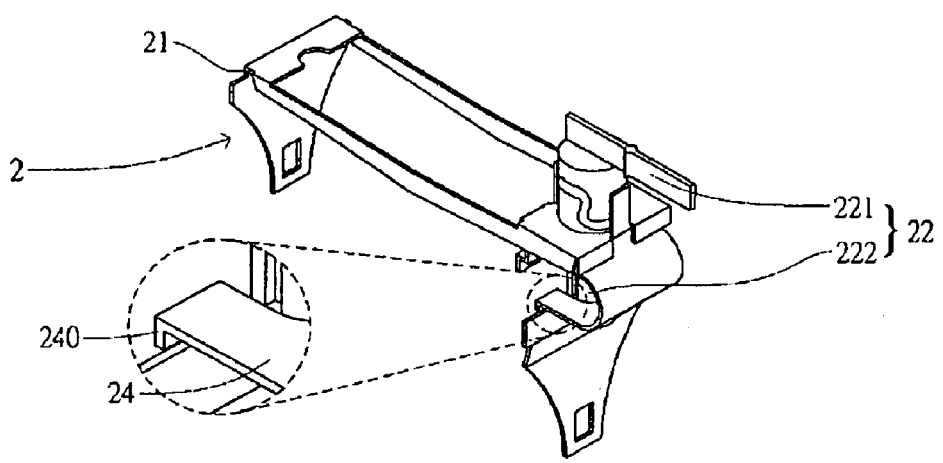
FIG. 16 is an assembled perspective view of the third embodiment of a retaining tool with rotational locating device according to the present invention shown in FIG. 15.

Referring to FIGS. 15 and 16, the sixth embodiment of a retaining tool with rotational locating device according to the present invention is illustrated. The difference of the present embodiment from the third embodiment is in that the respective holding arm 212 has a projection 2121 to keep contact with the guiding groove 2210 instead of the elongated hole being passed through with the spindle 23 as shown in FIGS. 9 and 10. Once the locator 22 is turned the adjustable unit 221 is capable of moving downward to push the locking unit 222 or upward to release from the locking unit 222 in addition to rotating so that the locking unit 222 is able to perform the job of engagement and disengagement.

Figure 17:
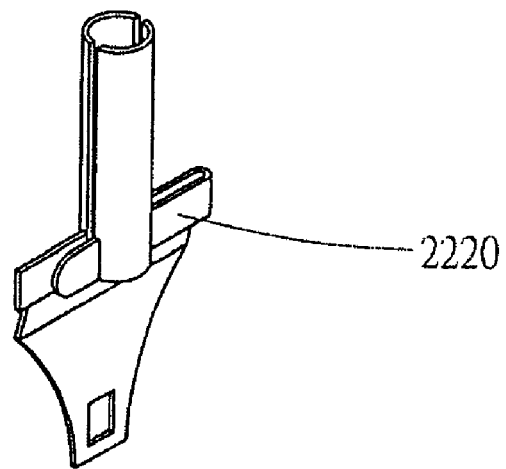
FIG. 17 is a perspective view illustrating a feasible structure of the lock unit in the retaining tool with rotational locating device according to the present invention.
Figure 18:
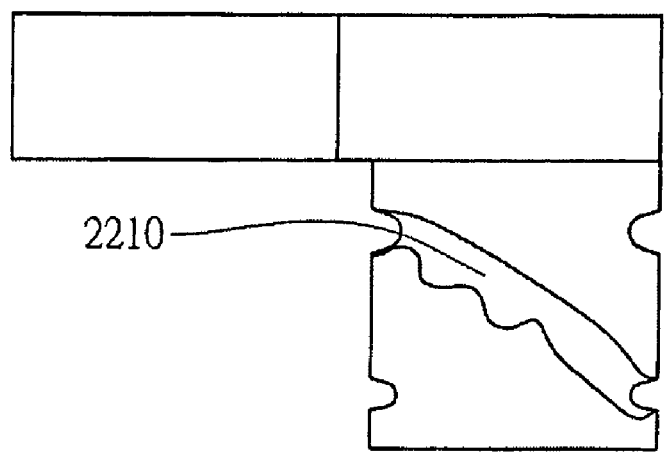
FIG. 18 is perspective view illustrating a feasible structure of the guide groove in the adjustable unit of the retaining tool with rotational locating device according to the present invention.

Furthermore, referring to FIG. 17, the locking unit 222 of the preceding embodiments provides a reinforcing part 2220 at the top of the lock part to strengthen the locking unit 222. FIG. 18 shows the guiding groove 2210 of the adjustable unit 221 is arranged with a continuous curve extending downward from an uppermost end and a lowest end at the circumferential side of the adjustable unit 221 and the guiding groove 2210 has a slight indentation at the lowest end thereof to force the joining seat 4, the CPU 3 and the heat sink 5 being attached to each other tightly.

While the invention has been described with referencing to preferred embodiments thereof, it is to be understood that modifications or variations may be easily made without departing from the spirit of this invention, which is defined by the appended claims.

What is claimed is:

1. A retaining tool with rotational locating device comprising:

a frame being two-parallel-elongated arm shape with a first end thereof providing a first lock part extending downward;

a locator being disposed at a second end of the frame and providing a second lock part being opposite to the first lock part; and a joining seat, which is attached with a central processing unit and receives a heat sink, providing a jut at two opposite lateral sides thereof corresponding to said two lock parts respectively;

wherein the frame has a flat plate portion at a second end thereof, provides a circular opening with a diametrical bar at the flat plate portion and an upward extending holding arm with an elongated hole from two opposite sides of said flat plate portion; wherein the locator further comprises:

a locking unit, which is cylindrical with an elongated diametrical slit extending downward from an upper end thereof, passes through the circular opening in a way of the diametrical bar inserting in said slit and the second lock part being attached to a lower end thereof; and a cylindrical shaped adjustable unit providing a circumferential side and a top, having a continuous curve shaped guiding groove at the circumferential side with an uppermost end and a lowermost end, providing a handle extending outward from the top, receiving said upper end of the locking unit and being rotationally engaged to the lock unit with a spindle passing through said elongated hole, said locking unit and said guiding groove.

2. The retaining tool with rotational locating device as defined in claim 1, wherein the lowermost end provides a slight indentation.

3. The retaining tool with rotational locating device as defined in claim 1, wherein a C-shaped elastic member is provided to be passed through by said lock unit.

4. The retaining tool with rotational locating device as defined in claim 3, wherein a lower end of said C-shaped elastic member has a bend to hold said second lock part.

* * * * *